United States Patent [19]

Shimizu et al.

[11] 4,139,881

[45] Feb. 13, 1979

[54] CIRCUIT BOARD ASSEMBLY AND METHOD OF MANUFACTURING THE SAME

[75] Inventors: Teruo Shimizu, Katano; Tetsuo Matsuoka, Neyagawa, both of Japan

[73] Assignee: Matsushita Electric Industrial Co., Ltd., Kadoma, Japan

[21] Appl. No.: 861,447

[22] Filed: Dec. 16, 1977

[30] Foreign Application Priority Data

Dec. 17, 1976 [JP] Japan .................................. 51/152516

[51] Int. Cl.² .............................................. H05K 1/04
[52] U.S. Cl. .................................... 361/400; 361/406; 361/409; 228/180 R; 228/259
[58] Field of Search ........................ 361/400, 406, 409; 228/259, 180 R

[56] References Cited

U.S. PATENT DOCUMENTS 3,859,722  1/1975  Kinsky et al. ........................ 228/259
3,991,347  11/1976  Hollyday ............................. 361/406

Primary Examiner—David Smith, Jr.
Attorney, Agent, or Firm—Wenderoth, Lind & Ponack

[57] ABSTRACT

A circuit board assembly comprising an electrically insulating circuit board of synthetic resin having at least one surface laminated with conductive sheet. An electric and/or electronic element, such as resistor or capacitor, of a type which has no lead wires extending outwardly therefrom for external electric connection, but which is constituted by a substantially cubic body having its opposite ends applied with respective films of electro-conductive material which serve as terminal electrodes, is mounted on the circuit board with the electrodes soldered to the respective conductive sheets through immersion of said circuit board, particularly laminated surface thereof, into the pool of molten solder. The circuit board has at least one aperture formed adjacent the area where the element is to be positioned for releasing bubbles evolved in the pool of the solder.

6 Claims, 7 Drawing Figures

CIRCUIT BOARD ASSEMBLY AND METHOD OF MANUFACTURING THE SAME

The present invention relates to a circuit board assembly, and more particularly, to a printed circuit board assembly which employs electronic and/or electric elements, such as capacitors, resistors, semi-conductors, etc., of substantially cubic shape, namely, chips of elements, having no particular lead lines extending therefrom but only electrode surfaces for the external connection thereof, and also a method of manufacturing such printed circuit board employing chips of elements.

Figure 1:
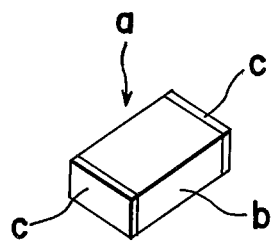

Recently, there have been developed electronic and/or electric elements a in the form of chips, as shown in FIG. 1 for one example, comprising an insulated casing b made of non-metallic material and containing therein necessary elements operable as resistor, capacitor, semiconductor or others, and one or more, shown as two, electrode surfaces c tightly attached to said casing b.

Generally, the printed circuit board of conventional type includes a board of insulated material such as synthetic resin having formed therein a plurality of holes for inserting from one side surface of two opposite flat surfaces thereof conductive lead lines, namely, legs, of various electronic and/or electric elements such as resistors, capacitors, diodes, relays, etc. of known type, and a conductive sheet, such as copper sheet, laminated on the other side surface of the board in a predetermined pattern for electric connection of the tips of each of the inserted legs onto the conductive sheet.

In order to employ the above described type of electric chips in the circuit board of the conventional type, each of the electric chips are placed on the other side surface of the circuit board such that two electrode surfaces c are electrically and mechanically connected to prearranged layers of conductive sheets. Therefore, the chip is substantially connected between the two adjacent layers of conductive sheets.

In order to electrically and mechanically connect the chip elements onto the other side surface of the circuit board, one method is to use conductive paste which is spread on the conductive sheet at places where the electrode surfaces of the chips contact. Thereafter, the chips are placed over the other side surface of the circuit board correspondingly to the place where said conductive paste is spread. And then, the circuit board is heated in an oven, or the like, for hardening the conductive paste.

Another method is to use soldering paste which is spread on the conductive sheet as places where the electrode surfaces of the chips contact. Thereafter, the chips are placed over the other side surface of the circuit board correspondingly to the place where said soldering paste is spread. Subsequently, the soldering paste is fused by a suitable heating means and then, is again hardened for connecting the chip onto the circuit board.

However, in either one of the above described two methods, there are such disadvantages that it is difficult to spread the conductive paste or soldering paste in a constant amount which is necessary for electrical connection and mechanical support of the chip onto the circuit board and also it is difficult to determine the spreading position of the paste before placing such chips. Furthermore, since other electric elements of known types are normally soldered onto the conductive layer by the immersion of circuit board, particularly said other surface thereof, into the pool of molten solder such that the molten solder adheres around tip ends of the respective legs for the connection between the leg and the conductive layer. Application of the above described methods, however, complicates a soldering step for constructing the circuit board.

Figure 2A:
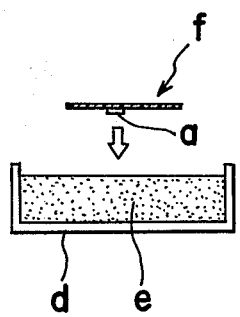
Figure 2B:
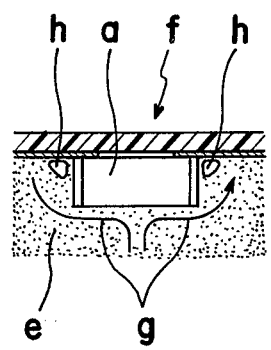

A further method which eliminates such disadvantages as described above is to immerse the other side surface of the circuit board, temporarily provided with chips, into the pool of molten solder as shown in FIGS. 2a and 2b, in which FIG. 2a shows a pool or container d filled with molten solder e which is ready to receive the circuit board f provided with the chip element a, while FIG. 2b shows the condition of the circuit board f in an enlarged scale, where the other side surface thereof is immersed into the pool.

When dipping the other side of the circuit board into the pool, as shown in FIG. 2b, the molten solder flows towards the sides of the chip element as indicated by arrows g, while at the same time, bubbles h are lead around the sides of the chip. Such bubbles are formed by the air which is captured under the board when placing the board over the molten solder, or by the gas evolved from the material, such as flux, adhering on the circuit board, upon rise in the temperature.

When the circuit board is taken out from the pool, a certain amount of solder remains at the corner defined between the electrode surface c and the layer of conductive sheet with bubbles contained in the solder. Accordingly, such bubbles prevent the solder from being totally supplied to the corner, thus reducing the mechanical connection between the chip element and the board.

Figure 3A:
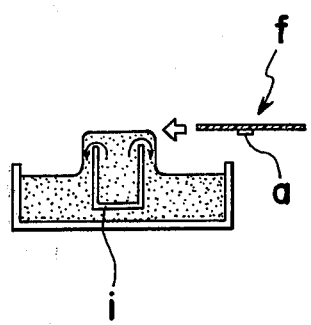
Figure 3B:
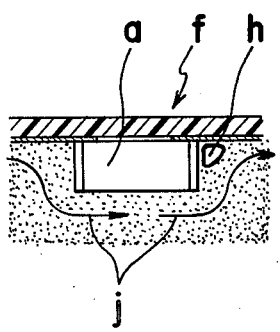

Likewise, the bubbles are produced, as shown in FIGS. 3a and 3b, around the side of the chip element when the circuit board f is moved past a pool of solder in which the molten solder springs out from an inner container i. In this case, the molten solder flows in a direction indicated by arrows j with respect to the circuit board f, as shown in FIG. 3b, so that the bubbles h are gathered at the right-hand side of the corner, when viewed in FIG. 3b.

Such bubbles as described above remains in the solder adhering to the circuit board and thus weakens the connection between the board and the chip element.

Accordingly, a primary object of the present invention is to provide an improved type of circuit board assembly which prevents from carrying such bubbles in the solder adhering at the corner defined between the electrode surface of the chip element and the conductive sheet of the circuit board.

Another object of the present invention is to present a method of manufacturing an improved type of circuit board assembly of the above described type.

In order to accomplish these and other objects, according to the present invention, the circuit board assembly comprises a board made of electrically non-conductive material having a pair of opposite flat surfaces in parallel relation to each other. At least one flat surface of the board is laminated with a conductive sheet in a predetermined pattern, and the board having at least one aperture formed therein. The circuit board assembly further comprises at least one article of a type which includes a body having at least one surface element connectable to the circuit board by the operation of soldering. The article is placed on the circuit board such that the one surface element forms an angle or corner portion cooperatively with the conductive sheet laminated on the one flat surface of the board, while at the same time the one surface element is positioned adjacent the aperture formed in the board, whereby the solder for connecting the one surface element and the conductive sheet and for securing the article onto the board is provided in the corner portion while covering the aperture. Accordingly, the bubbles formed in the soldering material are released from the aperture.

Figure 4:
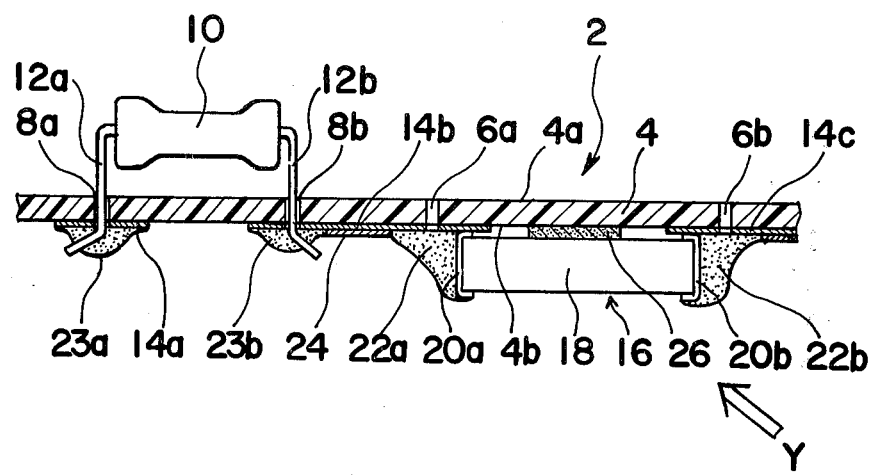
Figure 5:
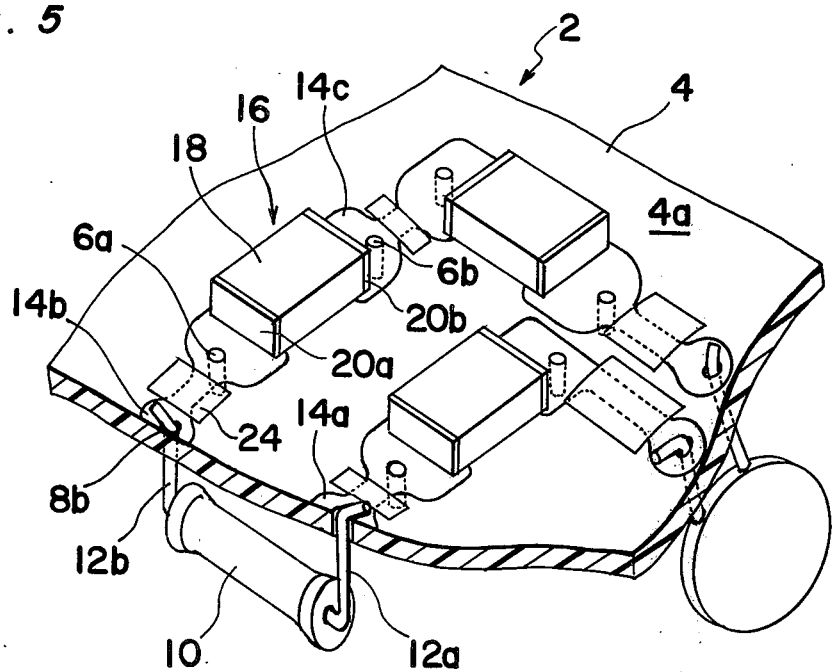

These and other objects and features of the present invention will become apparent from the following descriptions taken in conjunction with preferred embodiment thereof with reference to the accompanying drawings, in which;

FIGS. 1, 2a, 2b, 3a and 3b are drawings already referred to in the foregoing description, FIG. 1 being perspective view of an electric or electronic element presented in the form of chip, FIG. 2a being side cross sectional view of a soldering pool ready to receive a circuit board temporarily provided with the chip element shown in FIG. 1, FIG. 2b being a fragmentary view showing a condition of circuit board immersed into the pool of molten solder, FIGS. 3a and 3b being similar views to FIGS. 2a and 2b, but particularly showing modification thereof;

FIG. 4 is a cross sectional view of a circuit board assembly of the present invention; and FIG. 5 is a perspective view of a circuit board viewed in a direction Y shown in FIG. 4.

Referring to FIGS. 4 and 5, the circuit board assembly 2 of the present invention comprises a board 4 made of electrically insulating material, such as resin, having a pair of opposite flat surface 4a and 4b in parallel relation to each other. The board 4 is formed with two types of apertures, in which the first type of apertures, namely, bubble releasing apertures 6a and 6b, are spaced apart from each other in a predetermined distance, and the second type of apertures, namely, leg receiving apertures 8a and 8b are provided for inserting therein corresponding legs 12a and 12b of normal electronic or electric element 10 such as resistor, capacitor diode, relays, etc., from the upper flat surface 4a of the board 4. The lower surface 4b of the circuit board 4 is laminated with conductive sheets, such as copper sheets 14a, 14b and 14c in a predetermined pattern. A part of one pattern is shown in FIG. 5. Such laminated circuit board is generally called printed circuit board which is usually obtained through a known method of manufacturing such as etching.

An electronic or electric element 16 presented in the form of chip is provided in the lower surface 4b of the circuit board. The chip element 16 comprises a body 18 of substantially cubic shape and first and second electrodes 20a and 20b secured to the opposite flat surfaces of the body 18. The chip element 16 is held onto the lower surfaces 4b such that the first electrode 20a positioned adjacent the bubble releasing aperture 6a and approximately in perpendicular relation to the lower surface 4b is soldered with the conductive sheet 14b, while the second electrode 20b positioned adjacent the bubble releasing aperture 6b and approximately in perpendicular relation to the lower surface 4b is soldered with the conductive sheet 14c.

It is to be noted that the predetermined diatance between the pair of bubble releasing apertures 6a and 6b is slightly longer than the distance between the two electrodes 20a and 20b, so that the bubble releasing apertures 6a and 6b can be covered by the solder beads 22a and 22b.

End portion of each of the legs of the element 10 is also soldered onto the conductive sheet, and thus having solder beads 23a and 23b.

A solder resist layer 24 may be employed over the conductive sheet where it is not required to be soldered. These and other features of the conductive sheet are fully described in U.S. patent application Ser. No. 816,197 of Hitoshi Sawairi et al, assigned to the same assignee.

In order to construct the circuit board assembly 2 of the present invention, the printed circuit board is formed with a plurality of bubble releasing apertures 6a and 6b and, if necessary, a plurality of leg receiving apertures 8a and 8b at predetermined places over the board. Then, the electric elements 10 shown as only one element for instance of normal type are mounted on the board 4 on the upper surface 4a, such that the legs are inserted into corresponding apertures while tip ends are trimmed to a preferable length and are bent side-ways for temporarily holding the electric element over the board. Prior to, or after the electric element 10 being temporarily mounted on the circuit board, the chip elements 16 shown as one element for instance, are provided on the lower surface 4b of the circuit board by a deposition of bonding agent 26 between the board 4 and the chip element 16 at such position that the electrodes 20a and 20b position adjacent the bubble releasing apertures 6a and 6b, respectively. Such bonding agent 26 temporarily holds the chip element 16 in position as described above. The solder resist layer 24 may be provided, if necessary.

Thereafter, the lower surface 4b of the circuit board 4 is immersed into the pool (not shown) of molten solder in which the solder adheres in the corners defined between the electrodes 20a and 20b and conductive sheets 14b and 14c, respectively, as well as conductive sheets 14a and 14b where the legs of the electric element 10 extrude. During the board being immersed in the molten solder, the bubbles which directed to the corners are released from the bubble releasing apertures 6a and 6b, so that the solder beads 22a and 22b will not carry any bubbles therein.

Accordingly, as is apparent from the foregoing description, the circuit board assembly of the present invention has bubble releasing apertures formed in the board adjacent the electrodes of the chip elements, so that the bubbles evolved from the air or gas are released from the apertures 6a and 6b, and thus, there will be no bubbles in the solder beads. Therefore, the solder beads effectively and rigidly connect the chip element onto the circuit board.

Furthermore, such soldering step for the chip elements is in common with the soldering step for the electric elements with legs, so that there is no additional step necessary for soldering the chip elements.

It is to be noted that the bubble releasing apertures formed in the circuit board assembly of the present invention can be also used as leg receiving apertures for mounting therein the legs of electronic or electric element when it is necessary to rearrange the circuit and that such bubble releasing apertures, when viewing the circuit board assembly of the present invention from the upper surface thereof, indicate the location of the chip elements provided on the lower surface of the board.

Although the present invention has been fully described by way of examples with reference to the accompanying drawings, it is to be noted that various changes and modifications are apparent to those skilled in the art. Therefore, unless such changes and modifications depart from the scope of the present invention, they should be construed as included therein.

What is claimed is:

1. A circuit board assembly comprising in combination:
   an electrically insulating circuit board having at least one surface thereof laminated with conductive sheet in a predetermined pattern, and having at least one sheet in a predetermined pattern, and having at least one aperture formed in said circuit board;
   at least one article having body and at least one surface element secured to said body, said surface element being connectable to said circuit board over said one surface thereof adjacent said one aperture;
   solder bead deposited at corner portion defined between the surface element and part of said conductive sheet by immersion of said one surface of the circuit board into a pool of molten solder so that said aperture releases bubbles produced in said molten solder under said circuit board for filling said corner with solder.

2. A circuit board assembly as claimed in claim 1, wherein said article is temporarily held in a position by a bonding means before depositing said solder bead.

3. A circuit board assembly as claimed in claim 1 further comprising at least one electric and/or electronic element of a type which has lead wires extending outwardly therefrom for external electric connection, said electric and/or electronic element mounted on the other surface of said circuit board such that lead wires are inserted into corresponding holes previously arranged in said circuit board and end of each of said lead wires is soldered onto the conductive sheet by immersion of said one surface of the circuit board into a pool of molten solder.

4. A circuit board assembly as claimed in claim 1, wherein said article is an electric and/or electronic element.

5. A circuit board assembly as claimed in claim 1, wherein said body is substantially a cubic body and said surface element being made of electroconductive material which serve as terminal electrode.

6. A method of manufacturing a circuit board assembly including an electrically insulating circuit board having at least one surface thereof laminated with conductive sheet in a predetermined pattern, and at least one article having body and at least one surface element being connectable to said circuit board over said one surface thereof, said manufacturing method comprising steps of:
   (a) forming at least one aperture in said circuit board;
   (b) holding said article temporarily on said one surface of the circuit board adjacent the aperture;
   (c) immersing said one surface of the circuit bard into a pool of molten solder, during immersion said aperture releases bubbles produced in the molten solder under said circuit board; and
   (d) taking said circuit board out from the pool of molten solder, thereby solder bead being deposited at corner portion defined between the surface element and part of said conductive sheet.

* * * * *